United States Patent
Patel et al.

(10) Patent No.: US 6,808,942 B1
(45) Date of Patent: Oct. 26, 2004

(54) METHOD FOR CONTROLLING A CRITICAL DIMENSION (CD) IN AN ETCH PROCESS

(75) Inventors: Nital Patel, Plano, TX (US); Brian Smith, Plano, TX (US); Jeffrey S. Hodges, Plano, TX (US); Dale R. Burrows, Wylie, TX (US); Yu-Lun Lin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/444,345

(22) Filed: May 23, 2003

(51) Int. Cl.[7] ............................................. H01L 21/00
(52) U.S. Cl. ........................................... 438/8; 356/630
(58) Field of Search ............................. 438/5, 8, 9, 14, 438/16; 356/600, 630

(56) References Cited

U.S. PATENT DOCUMENTS

| | | |
|---|---|---|
| 5,926,690 A | 7/1999 | Toprac et al. |
| 6,235,440 B1 | 5/2001 | Tao et al. |
| 2003/0015699 A1 | 1/2003 | Su |
| 2003/0048458 A1 * | 3/2003 | Mieher et al. .............. 356/601 |

* cited by examiner

*Primary Examiner*—Luan C. Thai
*Assistant Examiner*—Lisa Kilday
(74) *Attorney, Agent, or Firm*—Peter K. McLarty; W. James Brady, III; Frederick J. Telecky, Jr.

(57) ABSTRACT

The present invention provides a method for determining resist trim times in an etch process. In one embodiment of the invention, the method for determining resist trim times includes obtaining resist profile data and critical dimension (CD) data of a patterned resist layer using a scatterometer, in a step 520, and then obtaining an estimated trim time of the patterned resist layer using the resist profile data and critical dimension data, in steps 530–550.

24 Claims, 6 Drawing Sheets

METHOD FOR CONTROLLING A CRITICAL DIMENSION (CD) IN AN ETCH PROCESS

TECHNICAL FIELD OF THE INVENTION

The present invention is directed, in general, to a method for manufacturing a semiconductor device and, more specifically, to a method for controlling a critical dimension (CD) in an etch process.

BACKGROUND OF THE INVENTION

Current demands for high density and performance associated with ultra large scale integration require submicron features, increased transistor and circuit speeds, and improved reliability. Such demands require formation of device features with high precision and uniformity, which in turn necessitates careful process monitoring, including frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (i.e., a photoresist layer), which has been previously coated on a layer, such as a polysilicon or metal layer formed on the silicon wafer. The transfer of the mask pattern onto the photoresist layer is conventionally performed by an optical exposure tool such as a scanner or a stepper, which directs light or other radiation through the mask to expose the photoresist. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. Design rules set limits on critical dimension ("CD"), which may be defined as any linewidth of interest in a device containing a number of different linewidths. The CD for most features in ultra large scale integration applications is on the order of a fraction of a micron, however, it generally depends on the specific feature.

As design rules shrink and process windows (i.e., the margins for error in processing) become smaller, inspection and measurement of surface features' CD, as well as their cross-sectional shape ("profile") are becoming increasingly important. Deviations of a feature's CD and profile from design dimensions may adversely affect the performance of the finished semiconductor device. Furthermore, the measurement of a feature's CD and profile may indicate processing problems, such as stepper defocusing or photoresist loss due to over-exposure.

In an effort to reduce the aforementioned deviations in post-etch feature CD, the art currently calculates the etch bias of the process. Etch bias is defined as the amount of change in the final dimensions of the feature relative to the as-patterned dimensions of the photoresist used to form the feature. In other words the etch bias places a value on the accuracy of the pattern transfer from the lithography process to the etch process. Currently, for pattern levels where the CD bias is controlled by changes to the etch process for each lot, etch bias prediction is based on the photoresist CD alone. Generally, this photoresist CD is measured using conventional measurement techniques, such as a scanning electron microscope (SEM) or other technique. Unfortunately, however, photoresist CD alone, and especially that obtained using SEM, provides inconsistent data. If used, the inconsistent data often compromises the manufacturing process.

Accordingly, what is needed in the art is a simple, cost-effective methodology for fast and meaningful identification and correction of CD variation.

SUMMARY OF THE INVENTION

To address the above-discussed deficiencies of the prior art, the present invention provides a method for determining etch process conditions in an etch process. In one embodiment of the invention, the method for determining the etch process conditions includes obtaining resist profile data and critical dimension (CD) data of a patterned resist layer using a scatterometer, and then obtaining an estimated etch process condition of the patterned resist layer using the resist profile data and critical dimension data.

In an alternative embodiment, the present invention provides a method for controlling a critical dimension (CD) in an etch process. Among other things, the method for controlling a CD in an etch process includes, obtaining resist profile data and critical dimension (CD) data of a patterned resist layer using a scatterometer. From the resist profile data, the method generates an empirical model, and then uses the empirical model to configure an etch process for the patterned resist layer.

Further, the present invention provides a method for manufacturing a semiconductor device using the aforementioned method for controlling a CD in an etch process. In addition to that disclosed above, the method for manufacturing a semiconductor device includes using the empirical model to adjust an etch process applied to the patterned resist layer to form a trimmed patterned resist layer and then forming a structure by etching a material exposed by the trimmed patterned resist.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

The present invention, in contrast to the prior art, provides (among other things) a reliable and accurate method for calculating etch process conditions in an etch process, including calculating etch process conditions to provide a desired etch bias. In further contrast to the prior art, the present invention allows the etch process conditions to be reliably and accurately calculated on a wafer-by-wafer basis, as compared to the lot average basis currently used by the prior art. Accordingly, a specific etch process condition may be calculated based on a specific resist layout, rather than an average of the resist layouts the process had previously seen.

Figure 1:
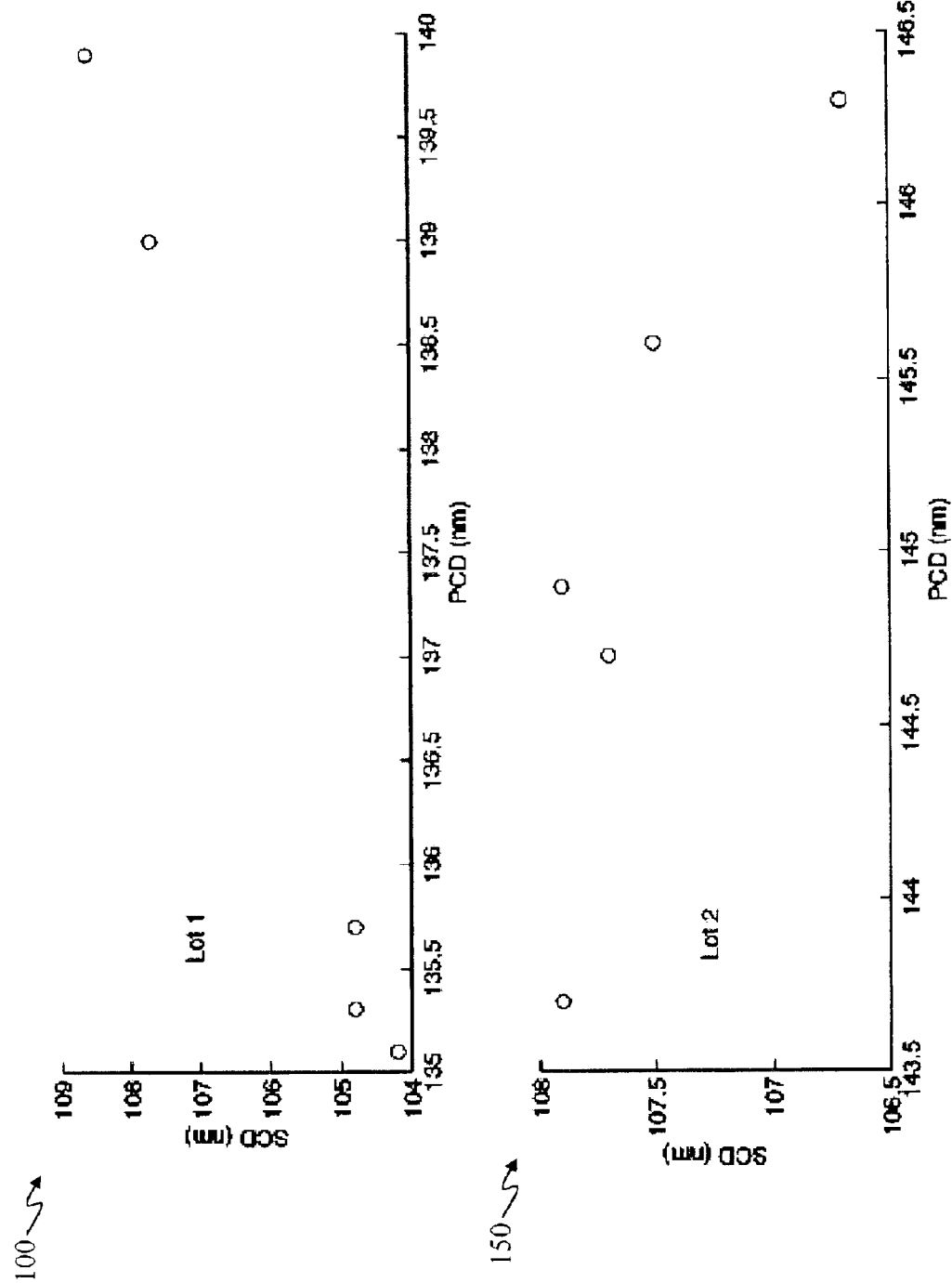
FIG. 1 illustrates two graphs describing at least one problem that results with only using post-pattern CD data for calculating the resist trim times.

The present invention, in further contrast to the prior art, recognizes that post-pattern critical dimension (CD) data (i.e., width data), alone, is many times insufficient, and often times misleading, for calculating the etch process conditions. Turning to FIG. 1, illustrated are two graphs 100, 150 showing at least one problem that results with only using post-pattern CD data for calculating resist trim times. In the example shown in FIG. 1, graphs 100 and 150 compare post-pattern CD data to post-etch CD data for five wafers in each lot. One would expect that as the post-pattern CD data increases, the post-etch CD data measurements would likewise increase. Such is the case for lot 1 represented by graph 100. However, lot 2 represented by graph 150 behaves in an opposite manner. Accordingly, blindly using the post-pattern CD data to adjust wafer trim times for lot 2 would actually negatively affect the post-etch CD. In the example shown in FIG. 1, each of the wafers of the lots were processed under the same etch recipe. In other words, each wafer had the same resist trim time, amongst other recipe parameters.

Figure 2:
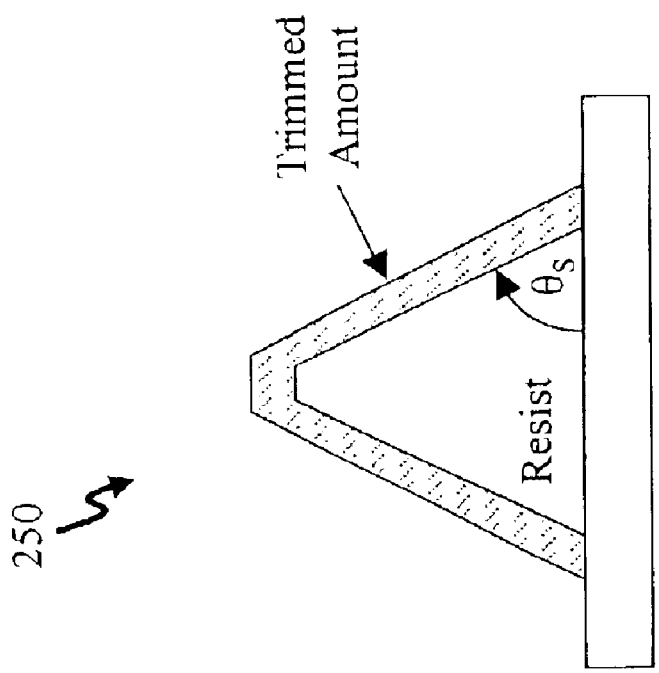
FIG. 2 illustrates two resist scenarios that might shed light on the discrepancy described in FIG. 1.
Figure 2:
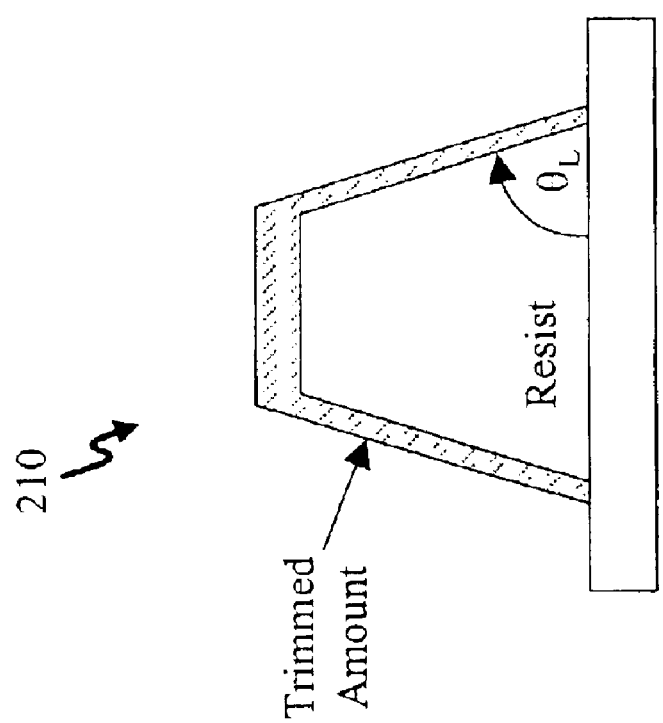
Figure 3:
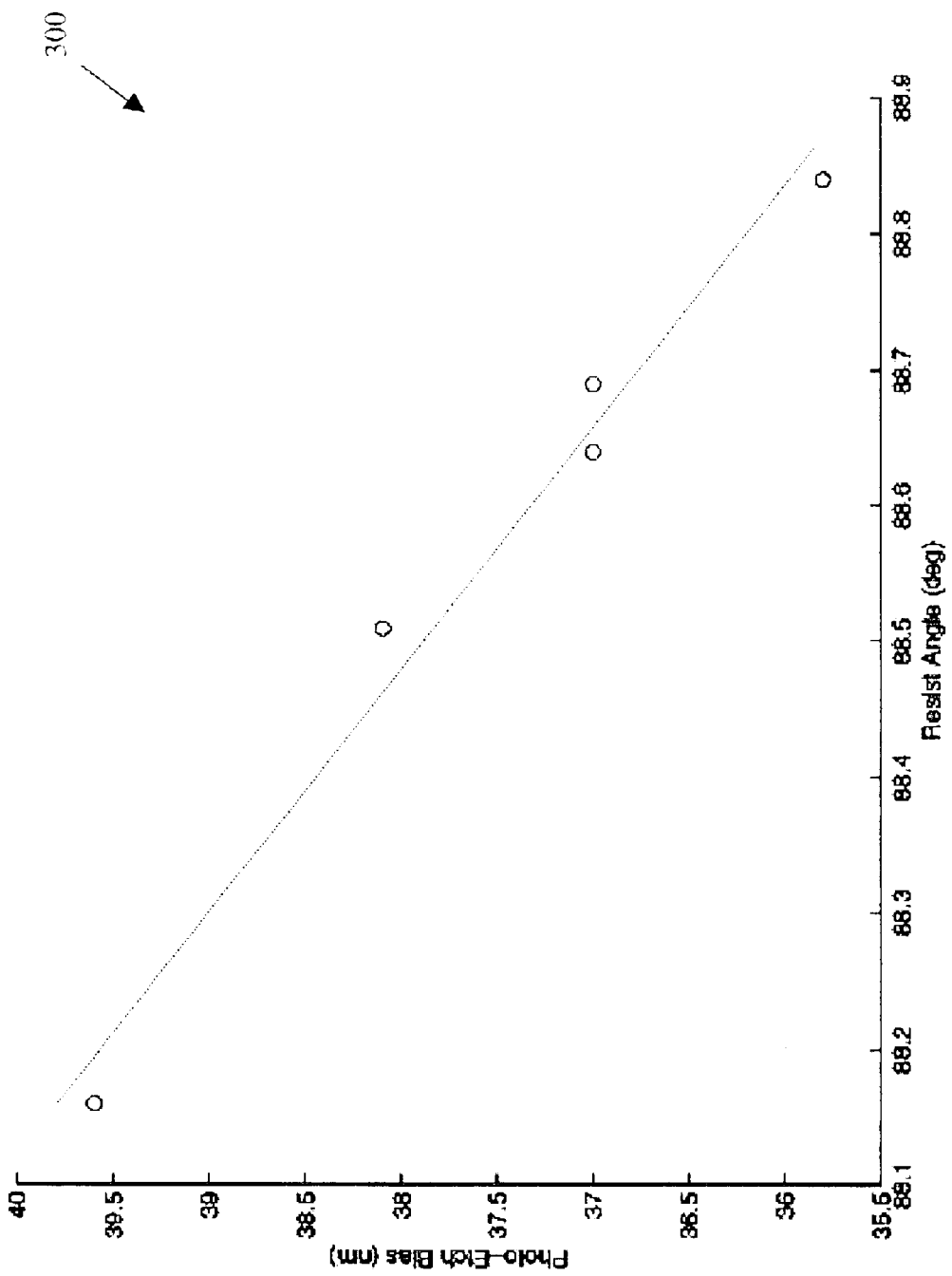
FIG. 3 illustrates a graph showing the impact of resist angle on the etch bias from FIG. 1.

Turning to FIG. 2, illustrated are two resist scenarios 210, 250 that might shed light on the aforementioned discrepancy. Both resist scenarios 210, 250 have the same post-pattern CD data, but the resist angle is different between the two. Clearly, for identical trim times, the scenario 210 corresponding to the larger resist angle ($\theta_L$) would experience a smaller change in post-resist trim CD, as compared to the scenario 250 having the smaller resist angle ($\theta_S$). This would imply that etch bias (i.e., the difference between the post-pattern CD and post-etch CD for a given resist structure) would be inversely impacted by the resist angle. For example, FIG. 3 illustrates a graph 300 showing the impact of resist angle on the etch bias for lot 2 from FIG. 1. In the current example, the impact of the resist angle on the etch bias is found to be about 5 nm per degree. Clearly then, the post-pattern CD data, alone, is insufficient to calculate the resist trim times.

Figure 4:
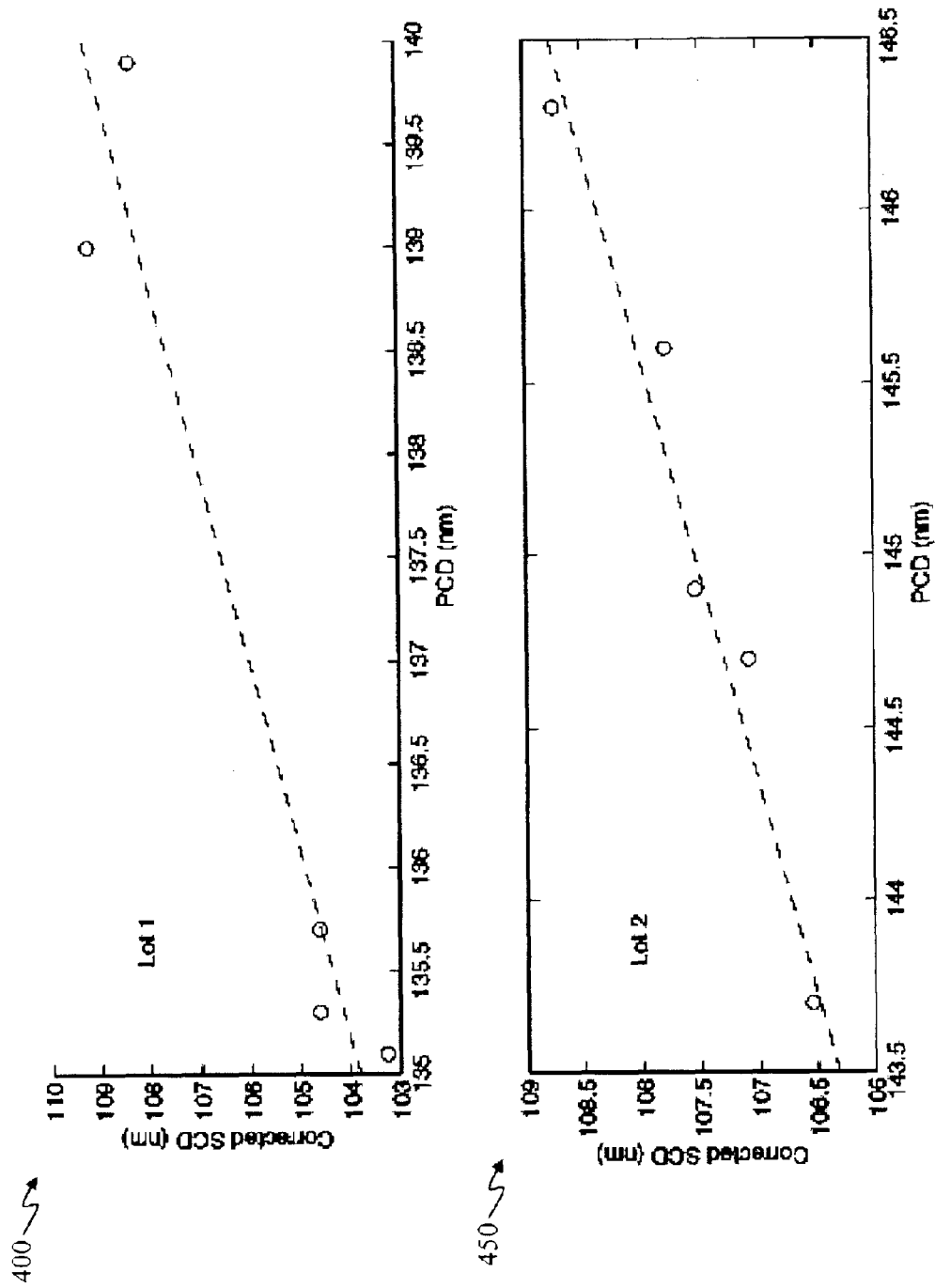
FIG. 4 illustrates two additional graphs representing the two graphs shown in FIG. 1 after normalizing the within lot data to the sidewall angle variation.

Turning now to FIG. 4, illustrated are two graphs 400, 450, representing the two graphs 100, 150, shown in FIG. 1 after normalizing the within lot data to the sidewall angle variation. This normalization, among other ways, may be achieved by correcting each wafers' post-etch CD data to the mean sidewall angle measured for the wafers. What results are the graphs 400, 450. Note where graph 150 of FIG. 1 was previously inconsistent with that of graph 100, such as might have been obtained only taking into account the post-pattern CD data, graphs 400 and 450 are consistent with one another.

While the above discussion has shown that sidewall angle data plays an important role in reliably and accurately calculating etch process conditions, and particularly resist trim times, those skilled in the art understand that other similar parameters may provide similar results. Namely, any parameter associated with the resist profile, including resist thickness, might provide similar results. Similar results are also obtained for calculating other etch process conditions also.

Figure 5:
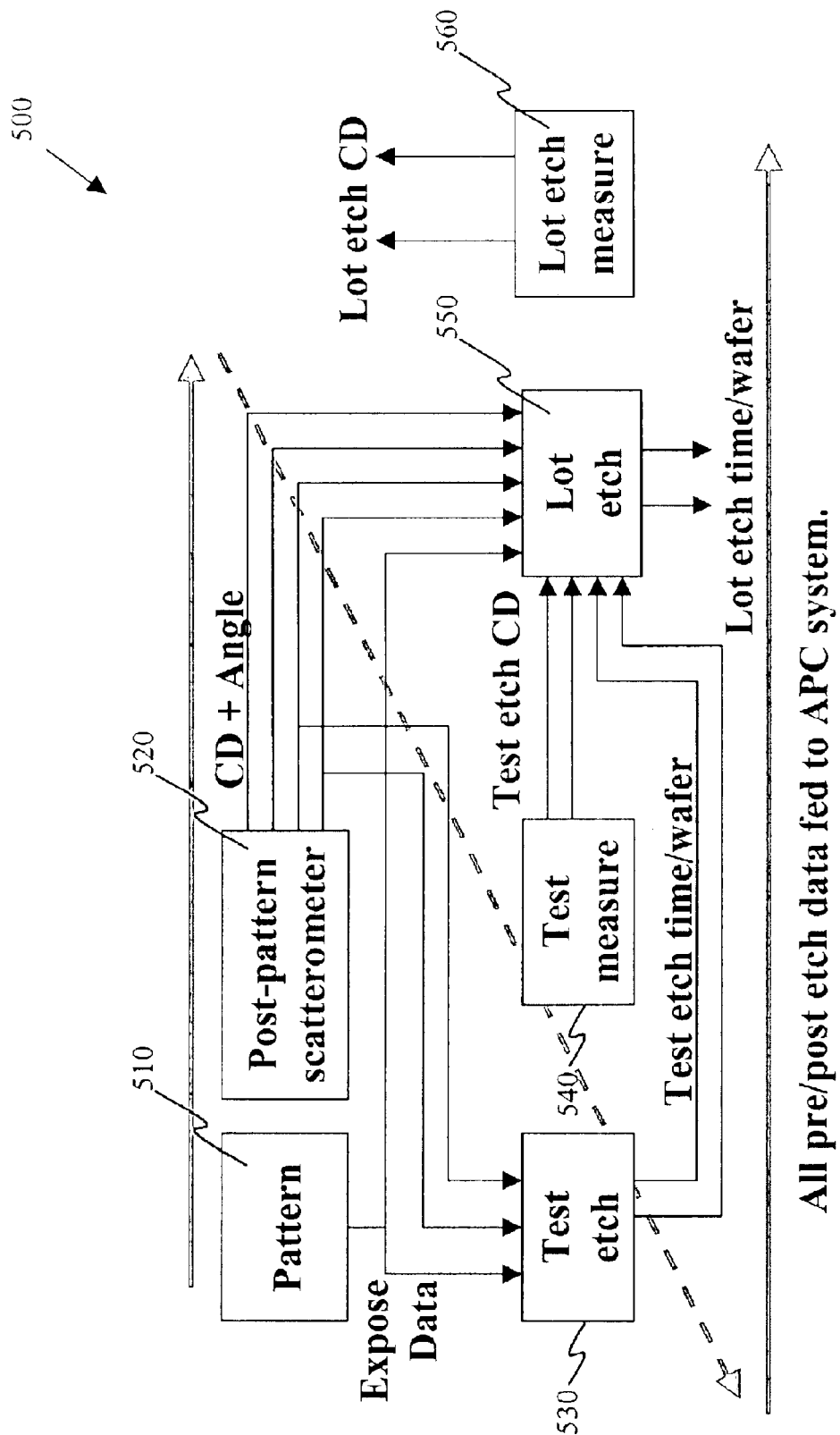
FIG. 5 illustrates a flow chart showing a control method for controlling critical dimensions in an etch process by adjusting the fabrication parameters or "recipe" for a resist etch step previous to a feature etch step in the etch process.

Referring now to FIG. 5, a flow chart illustrates a control method for controlling CDs in an etch process 500 by adjusting the fabrication parameters or "recipe" for a resist etch step previous to a feature etch step in the etch process. In one particular embodiment, the CDs are controlled using resist trim time as a control variable to drive the CDs to a target value. In contrast to the prior art, the embodiments of the present invention use resist profile data, in addition to resist CD data, obtained from a scatterometer to obtain an estimated resist trim time.

As indicated in the embodiment described in FIG. 5, the etch process 500 initiates with the patterning of a resist layer (or layers) in a step 510. While not always the case, often at least one lot of wafers are patterned in the same step 510. Accordingly, for purpose of the present discussion, and to keep things simple, the remainder of the embodiments of FIG. 5 will be discussed with respect to one lot of wafers, consisting of 24 individual wafers. Those skilled in the art understand, however, that this should not limit the present invention in any fashion, and any number of wafers or lots could easily be used.

Subsequent to the patterning step 510, resist profile data and resist CD data are obtained of the patterned resist layer for each of the 24 individual wafers, in a step 520. The resist profile data may comprise a plurality of different types of information. For example, the resist profile data may include, among other things, resist sidewall angle data, resist thickness data, or in an extreme embodiment a multiple order equation mathematically characterizing a complex resist sidewall shape. Additionally, other information may be included within the resist profile data.

In the embodiment disclosed herein, the resist profile data, and possibly the CD data, is obtained using a scatterometer. Whether it be integrated or stand alone, the scatterometer provides quick, accurate and reliable resist profile information. Previous techniques, such as using a scanning electron microscopes (SEM), can not accurately provide this information. Further, even if the previous techniques were able to obtain this data, those techniques would be entirely too slow to be practical. When both the resist profile data and CD data are obtained using a scatterometer, often both are simultaneously obtained using the same scatterometer.

After obtaining the resist profile data and CD data for each of the wafers, at least one of the wafers (and preferably from about two to about five of the wafers) is removed from the lot and passed to certain testing steps. The remaining wafers are forwarded to a lot etching step, discussed infra. Using the test wafer's (i.e, removed wafer's) resist profile data and CD data, an estimate of the test wafer's resist trim time is obtained. In one embodiment, in addition to the test wafer's resist profile data and CD data, exposure data from the patterning step 510 is fed forward and included within the rough approximation of the test wafer's resist trim time calculation.

Thereafter, in a test etch step 530, the approximated resist trim time is used to trim the resist of the test wafer. As indicated above, the resist trim time, in certain embodiments, is used as a control variable to drive the CDs to a target value. Accordingly, in the same test etch step 530, the trimmed resist portions are then used to etch a structure, such as a gate structure, for the test wafer. Often the resist trim step and the feature etch step are conducted in the same process chamber. For example, if required, the etch recipe could be tailored for the different purposes and materials.

After the test etch step 530, and in a test measure step 540, the post-etch feature CD data for the test wafer is obtained. Taken together, the post-etch feature CD data, the resist profile data and the resist CD data can be used to generate an empirical model for calibrating an etch process for the remainder of the wafers. Obviously, calibrating the etch process for the remainder of the wafers includes calculating resist trim times for each of the wafers. In one embodiment of the invention, the trim time may be calculated using the equation:

$$\mathrm{trim}=f(t,d,s)=At+Bd+Cs+D$$

where A is the etch time coefficient, t is the etch time, B is the resist CD coefficient, d is the resist CD, C is the resist sidewall angle coefficient, s is the resist sidewall angle, and D is the offset (intercept). It should be noted, however, that various other known and hereafter discovered equations might be used to calculate the resist trim times. Further, the same equation may be used for test etch. For example, in general test etch data may be used to update a subset of the coefficients of the equation for calculation lot etch times. This, however, is a "one-shot" lot specific calculation and is different from the filtered updates referred to later.

Consequently, in a lot etch step 550, the empirical model, and the obtained resist profile data and the CD data for each of the wafers is used not only to trim the patterned resist layers, but also to form structures on each of the wafers by etching a material exposed by the trimmed patterned resist layers. As a function of the unique method and model disclosed herein, the structures formed by the present invention should have critical dimension values within the prescribed ranges. Further, the structures are not as susceptible to the issues described with respect to FIG. 1. Those skilled in the art understand that often many structures are formed on the same wafer, and thus may subsequently be electrically contacted to form an integrated circuit.

Uniquely, the empirical model may be applied to the individual resist profile data and the CD data obtained for each of the wafers, and therefore, the actual trim time can be tailored to each. Additionally, the empirical model may be further updated using certain filtering techniques, such as using a combination of exponential weighted moving average (EWMA) filters and Kalman filters. Other filters could conceivable be used for a similar purpose.

Therefore, in an additional embodiment, and in an optional step 560, the CDs for each of the aforementioned structures are obtained, and that information is fed back to the empirical model to further tailor the process. What results, is an always updating model, that tailors itself to each individual wafer, based upon that wafer's measured resist profile data and the CD data.

Figure 6:
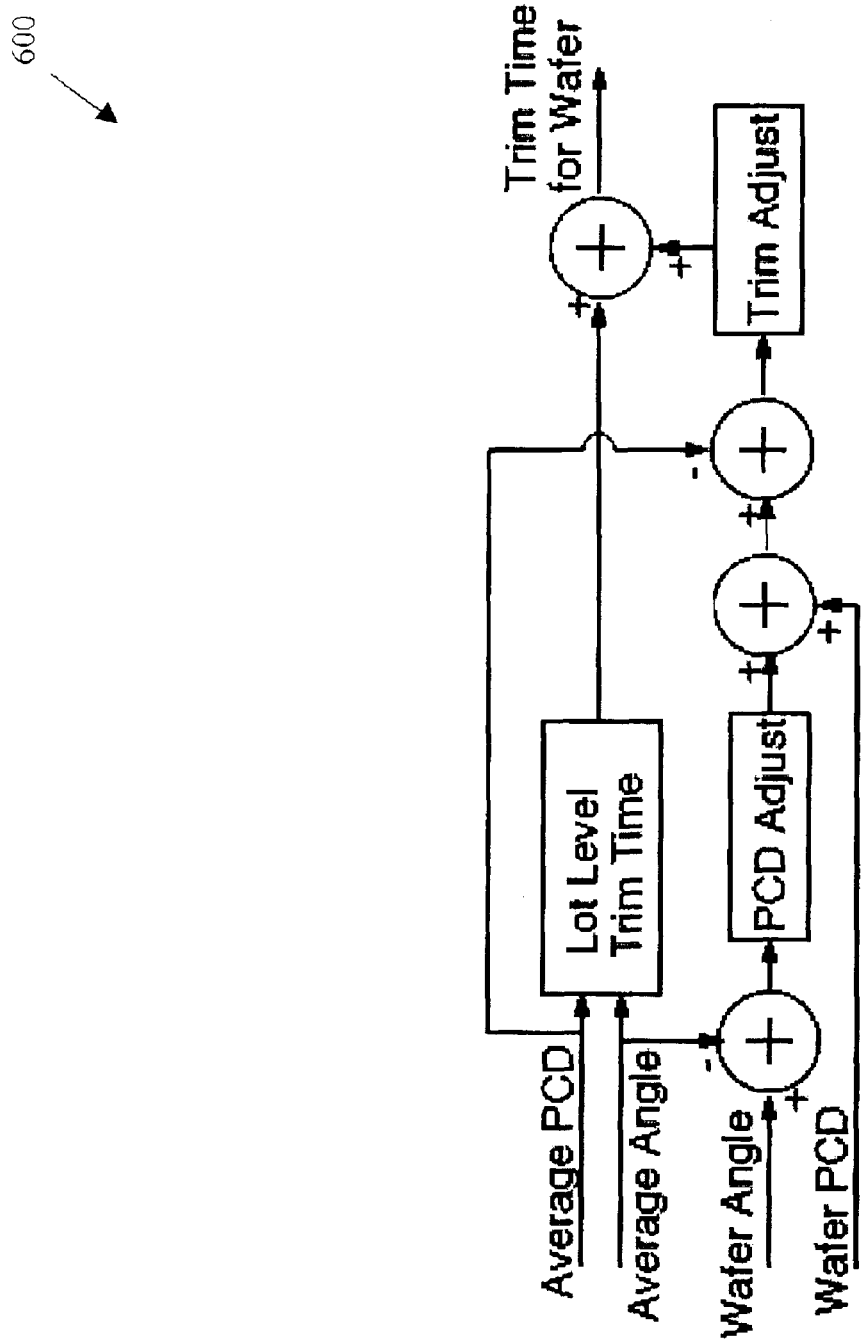
FIG. 6 illustrates additional details of how the trim time calculation in FIG. 5 may be implemented.

Turning briefly to FIG. 6, illustrated are additional details 600 of how the trim time calculation in FIG. 5 might be implemented. In the embodiment of FIG. 6, it is shown that initially a lot level trim time may be calculated from average resist profile data and average critical dimension data. Then, the resist profile data and critical dimension data may be normalized to correspond to the average resist profile data. Then, trim time offsets may be computed by comparing the normalized resist profile data and critical dimension data to the average critical dimension data. And then, the estimated trim time may be obtained of the patterned resist layer by adding the trim time offsets to the lot level trim time.

While a detailed etch process was described with respect to FIG. 5, those skilled in the art understand that every step described need not be implemented in every embodiment. For example, in a different embodiment, the test etch steps are not required. In such an embodiment, the process could go straight to the lot etch step 550 and use the model (or alternatively the equation set forth above) to calculate the trim times for the wafers in the lot.

Although the present invention has been described in detail, those skilled in the art should understand that they can make various changes, substitutions and alterations herein without departing from the spirit and scope of the invention in its broadest form.

What is claimed is:

1. A method for determining etch process conditions in an etch process, comprising:
    obtaining resist profile data and critical dimension (CD) data of a patterned resist layer using a scatterometer; and
    obtaining an estimated etch process condition using said resist profile data and critical dimension data.

2. The method as recited in claim 1 wherein said obtaining said resist profile data includes obtaining resist sidewall angle data.

3. The method as recited in claim 1 wherein said obtaining said resist profile data includes obtaining resist layer thickness data.

4. The method as recited in claim 1 wherein said estimated etch process condition is an estimated trim time.

5. The method as recited in claim 4 wherein obtaining an estimated trim time of said patterned resist layer includes obtaining the estimated trim time using the equation:

$$\mathrm{trim}=f(t,d,s)=At+Bd+Cs+D$$

where A is the etch time coefficient, t is the etch time, B is the resist CD coefficient, d is the resist CD, C is the resist sidewall angle coefficient, s is the resist sidewall angle, and D is the offset (intercept).

6. The method as recited in claim 1 wherein obtaining said estimated etch process condition of said patterned resist layer using said resist profile data and critical dimension data includes calculating a lot level trim time from average resist profile data and average critical dimension data, normalizing the resist profile data and critical dimension data to correspond to the average resist profile data, computing trim time offsets by comparing the normalized resist profile data and critical dimension data to the average critical dimension data, and adding the trim time offsets to the lot level trim time to obtain said estimated etch process condition of said patterned resist layer.

7. The method as recited in claim 1 wherein obtaining an estimated etch process condition further includes using exposure data from said patterned resist layer to obtain said estimated etch process condition.

8. A method for controlling a critical dimension (CD) in an etch process:
    obtaining resist profile data and critical dimension (CD) data of a patterned resist layer using a scatterometer;
    generating an empirical model including said resist profile data obtained from said scatterometer; and using said empirical model to configure an etch process for said patterned resist layer.

9. The method as recited in claim 8 further including updating said empirical model using a combination of exponential weighted moving average filters and Kalman filters.

10. The method as recited in claim 8 wherein said obtaining said resist profile data includes obtaining resist sidewall angle data.

11. The method as recited in claim 8 wherein said obtaining said resist profile data includes obtaining resist layer thickness data.

12. The method as recited in claim 8 wherein generating an empirical model includes generating an empirical model using the equation:

$$\mathrm{trim}=f(t,d,s)=At+Bd+Cs+D$$

where A is the etch time coefficient, t is the etch time, B is the resist CD coefficient, d is the resist CD, C is the resist sidewall angle coefficient, s is the resist sidewall angle, and D is the offset (intercept).

13. The method as recited in claim 8 wherein generating an empirical model includes generating an empirical model by calculating a lot level trim time from average resist profile data and average critical dimension data, normalizing the resist profile data and critical dimension data to correspond to the average resist profile data, computing trim time offsets by comparing the normalized resist profile data and critical dimension data to the average critical dimension data, and adding the trim time offsets to the lot level trim time to obtain said empirical model.

14. The method as recited in claim 8 wherein generating an empirical model further includes generating an empirical model using exposure data from said patterned resist layer to configure the etch process.

15. The method as recited in claim 8 wherein the method for controlling a critical dimension (CD) in an etch process is on a wafer-by-wafer process.

16. A method of manufacturing a semiconductor device, comprising:
    obtaining resist profile data and critical dimension (CD) data of a patterned resist layer using a scatterometer;
    generating an empirical model based upon at least said resist profile data obtained from said scatterometer; and
    using said empirical model to adjust an etch process applied to said patterned resist layer to form a trimmed patterned resist layer; and
    forming a structure by etching a material exposed by said trimmed patterned resist.

17. The method as recited in claim 16 wherein forming a structure includes forming a gate structure.

18. The method as recited in claim 16 further including updating said empirical model using a combination of exponential weighted moving average filters and Kalman filters.

19. The method as recited in claim 16 wherein said obtaining said resist profile data includes obtaining resist sidewall angle data.

20. The method as recited in claim 16 wherein said obtaining said resist profile data includes obtaining resist layer thickness data.

21. The method as recited in claim 16 wherein generating an empirical model includes generating an empirical model using the equation:

$$\mathrm{trim}=f(t,d,s)=At+Bd+Cs+D$$

where A is the etch time coefficient, t is the etch time, B is the resist CD coefficient, d is the resist CD, C is the resist sidewall angle coefficient, s is the resist sidewall angle, and D is the offset (intercept).

22. The method as recited in claim 16 wherein generating an empirical model includes generating an empirical model by calculating a lot level trim time from average resist profile data and average critical dimension data, normalizing the resist profile data and critical dimension data to correspond to the average resist profile data, computing trim time offsets by comparing the normalized resist profile data and critical dimension data to the average critical dimension data, and adding the trim time offsets to the lot level trim time to obtain said empirical model.

23. The method as recited in claim 16 wherein generating an empirical model further includes using exposure data from said patterned resist layer to generate said empirical model.

24. The method as recited in claim 16 where forming a structure includes forming a first structure and wherein the method further includes forming a second structure and electrically contacting the structures to form an integrated circuit.

* * * * *